US006355991B1

(12) United States Patent
Goff et al.

(10) Patent No.: US 6,355,991 B1
(45) Date of Patent: Mar. 12, 2002

(54) HOT PLUG SWITCH MECHANISM

(75) Inventors: Donald J. Goff, Framingham; Michael W. Kement, Northboro; Brian R. Herrick, Lunenburg; John Pellegrino, Westford; Vincent T. Curran, South Walpole; Richard B. Charlantini, Groton, all of MA (US); Horie Takeyoshi, Nashua, NH (US)

(73) Assignee: Stratus Technologies International, S.A.R.L., Luxembourg ( * ) Notice: Subject to any disclaimer, the term of this patent is extended or adjusted under 35 U.S.C. 154(b) by 0 days.

(21) Appl. No.: 09/548,529

(22) Filed: Apr. 13, 2000

(51) Int. Cl.[7] .............................................. H01H 47/00
(52) U.S. Cl. ..................................................... 307/140
(58) Field of Search ................................ 307/139, 140, 307/142, 113; 361/679, 686, 737, 741, 752

(56) References Cited

U.S. PATENT DOCUMENTS

| | | | |
|---|---|---|---|
| 4,700,348 A | * | 10/1987 | Ise et al. |
| 4,835,737 A | * | 5/1989 | Herrig et al. |
| 4,999,787 A | * | 3/1991 | McNally et al. |
| 5,272,584 A | * | 12/1993 | Austruy et al. |
| 5,418,404 A | * | 5/1995 | Araoka et al. |
| 5,530,302 A | | 6/1996 | Hamre et al. ................ 307/147 |
| 6,232,676 B1 | * | 5/2001 | Kozyra et al. |

* cited by examiner

Primary Examiner—Edward H. Tso
(74) Attorney, Agent, or Firm—Testa Hurwitz & Thibeault, LLP

(57) ABSTRACT

A hot plug switch mechanism includes a card chassis and a motherboard in the chassis, the motherboard including a power bus, a plurality of connectors for connecting to a corresponding plurality of circuit boards and separate power switches connected between the power bus and each connector, each switch having an open position and a closed position. The switch mechanism also includes a plurality of actuator assemblies on the chassis corresponding to the plurality of switches on the motherboard each actuator assembly adapted to close the corresponding switch on the motherboard when the corresponding connector is connected to a circuit board. Preferably, each power switch is a Hall Effect switch and each actuator assembly includes a magnet which may be moved into proximity to the corresponding switch when the corresponding connector is connected to the circuit board.

15 Claims, 3 Drawing Sheets

HOT PLUG SWITCH MECHANISM

BACKGROUND OF THE INVENTION

This invention relates to the live insertion of circuit boards into a chassis or card cage, commonly referred to as "hot-swapping" the circuit boards. This allows a faulty board to be swapped out of a communication or electronic system and replaced by an operative board while the system remains up and running.

There are various known communication systems which incorporate circuit boards capable of live insertion into a hot chassis back plane or motherboard. In such systems, a switch is mounted to each circuit board, the switch controlling the power to the circuit board. In other words, the switch is connected between the power bus on the motherboard and the motherboard connector which couples power to the circuit board plugged into that connector. Often the switch is mounted near the front edge of the board and is closed after the circuit board is inserted into its appropriate slot in the chassis by the movement of that board's injector latch to its locking position or by the closure of a cover over that latch. In other cases, the power switch is located on the circuit board so as to be closed upon contact by the back plane or motherboard connector receiving that circuit board. Examples of the foregoing hot plug switch mechanisms are disclosed in U.S. Pat. No. 5,530,302.

Prior switch mechanisms of this type are disadvantaged in that they take up space on the printed circuit board where space is at a premium. Also, the prior switch mechanisms often comprise mechanical push button switches which do not always open and close when they should due to mechanical tolerances built into the chassis supporting the circuit boards. In other words, the closing of a printed circuit board's injector latch or latch cover may not always or reliably close the power switch on that circuit board. Furthermore, they are relatively expensive and are sometimes adversely affected by mechanical shock and vibration.

SUMMARY OF THE INVENTION

Accordingly it is an object of the present invention to provide an improved hot plug switch mechanism for controlling power to a printed circuit board when hotswapping that board.

An additional object is to provide a switch mechanism of this type which allows greater freedom in the layout of the board whose power is being controlled.

Another object of the invention is to provide such a switch mechanism which does not take up any space on the circuit board whose power is being controlled by that switch.

Still another object of the invention is to provide a hot plug switch mechanism which is relatively inexpensive.

A further object of the invention is to provide a hot plug switch mechanism which is reliable and relatively immune to vibration and other environmental effects.

The invention accordingly comprises the features of constructions, combination of elements and arrangement of parts which will be exemplified in the following detailed description, and the scope of the invention will be indicated in the claims.

Briefly, my hot plug switch mechanism controls the power to a printed circuit board inserted into the slot of a card cage or chassis in order to interface with a motherboard in the chassis. Instead of installing the power switch on the printed circuit board as has been done heretofore, it is mounted to the motherboard and opened and closed by an actuator assembly mounted to the chassis adjacent to the card slot for containing the printed circuit board to be controlled by that switch. In accordance with the invention, the power switch is an electronic proximity switch, preferably a Hall Effect switch, and the plunger mechanism includes a housing mounted to the chassis opposite the switch and a plunger slidably received in that housing. One end of the plunger facing the switch carries a magnet; the opposite end of the plunger is located adjacent to the entrance to the card slot for containing the associated circuit board. The plunger is movable in its housing toward and away from the motherboard and the switch thereon between an extended position which places the magnet sufficiently near the switch that the magnet's field closes the switch so that electrical power is delivered to the corresponding printed circuit board in the card slot, and a retracted position wherein the magnet is spaced far enough away from the switch that the switch opens and interrupts power to the circuit board. The plunger is normally biased to its retracted position, but may be moved to its extended position by the closure of a cover located at the entrance to the slot for the corresponding printed circuit board.

The usual card chassis contains positions or slots for many circuit boards. In accordance with this invention, the chassis includes a separate hot plug switch mechanism for each circuit board position.

When a printed circuit board is properly seated in its slot in the card chassis, the cover at the entrance to that slot being closed, the plunger of the corresponding actuator assembly is maintained in it's extended position so that the magnet at the end of that plunger is in close proximity to the corresponding power switch on the motherboard. As a result, the switch remains closed so that power is delivered to the corresponding circuit board. If for some reason it becomes necessary to remove that board from the card chassis, the cover at the entrance to the card slot containing that circuit board first has to be opened. As soon as the cover is opened, the plunger of the actuator assembly controlling the printed circuit board in that slot is released and springs to its retracted position. Since the magnet at the end of that plunger is no longer proximate the corresponding switch on the motherboard, that switch opens thereby disconnecting the circuit board in that slot from the power bus on the motherboard. The circuit board can then be removed from its slot in the chassis without effecting other circuit boards in the chassis or the operation of the system as a whole.

When a replacement board is inserted into the card slot, it is not powered up until the cover at the entrance to that slot is closed in order to secure that board in place. The closure of the cover moves the plunger of the corresponding actuator assembly to its extended position which places the magnet at the end of the plunger proximate to the Hall Effect switch on the motherboard. Resultantly, the magnet's field closes that switch thereby connecting the printed circuit board to the power source only after the circuit board has interfaced or connected with the motherboard.

It should be understood that the circuit board and/or motherboard may be provided with conventional control logic circuitry for detecting power loss when the hot plug switch mechanism is opened and for gradually removing power just prior to the disconnecting of the circuit board from the motherboard and for ramping up board power after insertion of a fresh circuit board and the closing of the corresponding power switch; see e.g. U.S. Pat. No. 5,530,302.

Thus, any circuit board in the card chassis can be removed and replaced without appreciably affecting the operation of the other circuit boards in the chassis. Since the hot plug switch mechanism which controls the power to each circuit board comprises a simple inexpensive electronic switch on the motherboard which is actuated by a plunger mechanism on the chassis, more real estate is available on the circuit boards for logic and other purposes. Also, the utilization for the power switch of an electronic proximity switch such as a Hall Effect switch in lieu of the typical mechanical switches provides additional advantages in terms of lower cost and greater reliability.

BRIEF DESCRIPTION OF THE DRAWINGS

For a fuller understanding of the nature and objects of the invention, reference should be made to the following detailed description taken in connection with the accompanying drawings, in which.

DESCRIPTION OF THE PREFERRED EMBODIMENT

Figure 1:
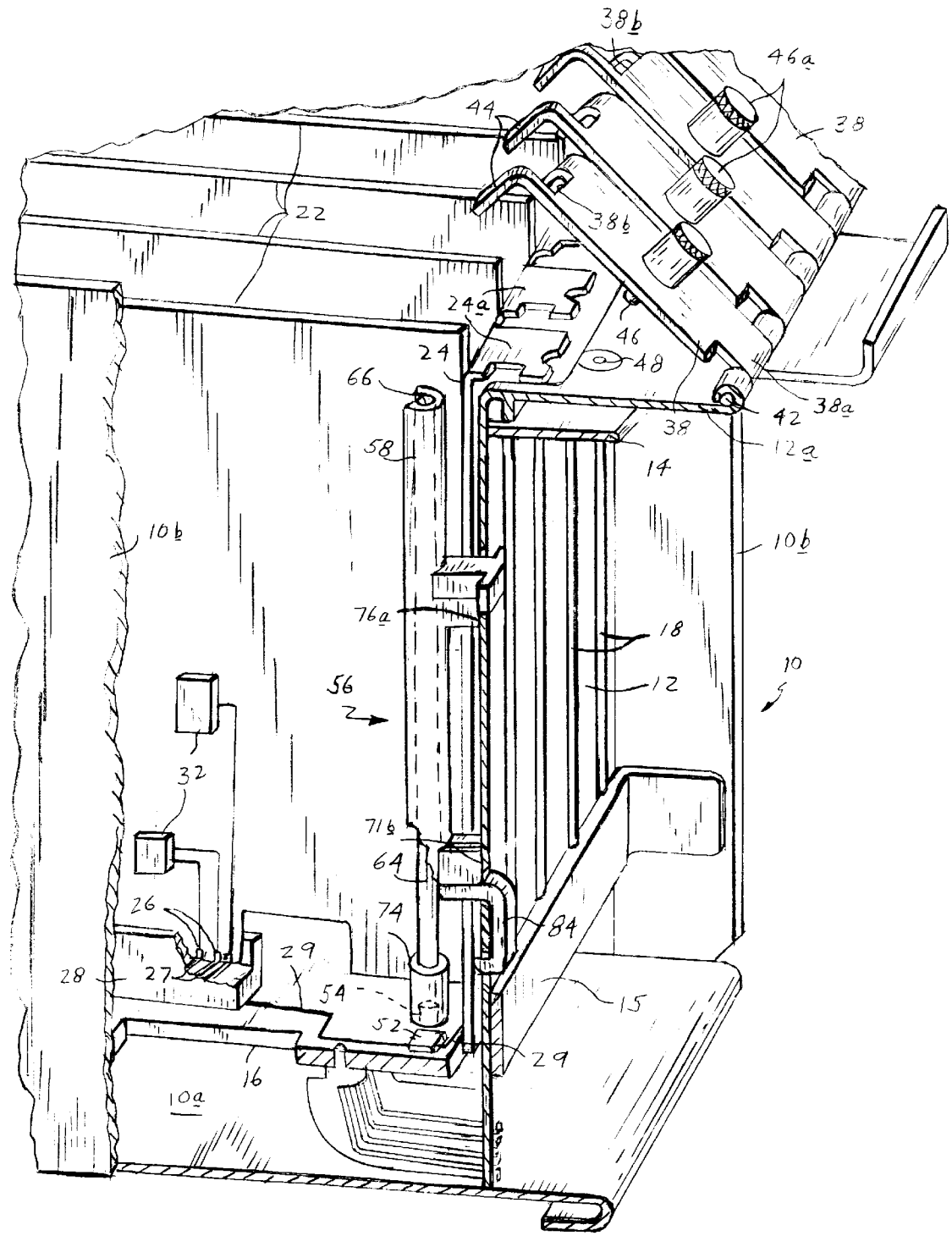
FIG. 1 is a perspective view with parts broken away showing a card chassis for printed circuit boards incorporating hot plug switch mechanisms according to the invention.

Refer now to FIG. 1 which shows a card chassis 10 having a bottom wall 10a and a pair of opposite side walls 10b extending up from the bottom wall. The chassis also includes a front wall 12 extending up from the bottom wall between the two side walls, the front wall being held in place by upper and lower brackets 14 and 15 whose opposite ends are anchored to the side walls. As seen in FIG. 1, the front wall 12 is recessed into the front of chassis 10 and extends up almost to the tops of side walls 10b where it is bent outwardly or forwardly to form a shelf or flange 12a which extends to the front of the chassis.

A motherboard 16 is positioned in the chassis behind front wall 12 thereof and being spaced above bottom wall 10a. A series of vertical slots 18 are formed in the front wall 12 which slots extend from the shelf 12a all the way down to bracket 15. Each of these slots is arranged and adapted to slidable receive a printed circuit board 22 inserted into chassis 10 through its open top. The illustrated chassis has four such slots 18 for supporting four circuit boards 22 in spaced-apart relation within the chassis as shown in FIG. 1.

Actually, each board 22 includes a bracket 24 mounted to the front or leading edge of the board which is the part of the board that actually engages in the corresponding slot 18 in the chassis front wall 12. Each bracket 24 has a forwardly extending flange 24a at its upper end which, when card 22 is received in its slot 18, is more or less flush with the front wall shelf 12a.

As shown in FIG. 1, when a card 22 is inserted into its slot 18, contacts 26 at the lower edge of the circuit board plug into or mate with contacts 27 in an edge connector 28 mounted to the motherboard 16 at each card position. In other words, there is a connector 28 on motherboard 16 opposite each card slot 18 in chassis front wall 12. The contacts 26 are connected electrically to various electrical elements 32 on circuit board 22 as is well known in the art. The contacts 27 connect to various leads and components on the motherboard. In particular, at least one contact 27 of connector 28 is connected to power bus conductor 29 on the motherboard.

Chassis 10 also includes a cover 38 at the entrance to each card slot 18 in the chassis. Each cover is an elongated member having one end 38a connected by a hinge 42 to the leading edge of the front wall shelf 12a so that the cover can swing between an open position shown in FIG. 1 wherein the cover is swung away from shelf 12a thereby exposing the entrance to the underlying slot 18 and a closed position shown in FIG. 4 wherein the cover lies flush against shelf 12a and covers the entrance to the card slot. The length of the cover is such that when a printed circuit board is inserted into the corresponding card slot 18 and the cover is closed, the cover overlies that card's bracket flange 24a thereby retaining that card in the slot.

For reasons that will become apparent, a relatively long finger 44 is formed at the free end 38b of each cover 38. Finger 44 extends at right angles to the nominal plane of the cover so that when the cover is in its closed position shown in FIG. 4, the finger 44 extends down into the chassis behind front wall 12 adjacent to the card slot 18 corresponding to that cover.

Each cover 38 may be releasable retained in its closed position by a threaded fastener 46 mounted to the cover which may be screwed down into a threaded hole 48 in shelf 12a by turning the knurled head 46a of the fastener. In the illustrated apparatus, the threaded hole 48 is formed by a nut mounted to the underside of shelf 12a opposite a hole in that shelf.

As shown in FIG. 1, an electronic proximity switch is mounted to motherboard 16 adjacent to each card position in the chassis, i.e. adjacent to each slot 18 in the front wall 12. Preferably, each switch 52 is a relatively inexpensive Hall Effect switch which is normally open, but may be closed by positioning a magnet in close proximity to the switch. Switch 52 is connected in circuit between the source of power to motherboard 16 and the connector 28 so that when switch 52 is open, no power is supplied to the circuit board 22 plugged into that connector. In other words, as shown in the drawing figure, each power bus conductor 29 on the motherboard leading to a connector 28 includes a power switch 52.

Each switch 52 is opened and closed by a magnet 54 carried by an associated plunger assembly 56 mounted to the interior face of front wall 12 adjacent to the associated card slot 18. Assembly 56 may be made for the most part of inexpensive molded plastic parts. Each such assembly comprises a housing 58 which defines a slide 62 for slidably receiving a plunger 64. The plunger is a rod-like element having an enlargement or head 66 at its upper end. A coil spring 68 is engaged around an upper end segment of the plunger adjacent to head 66 and the plunger is inserted into the upper end of the slide 62 and passed down through the housing until the spring 68 becomes compressed between head 66 and an abutment 72 spaced below the upper end of the slide. Once the plunger is positioned in the housing as shown in FIG. 2, a cap 74 containing a magnet 54 is engaged to the lower end of the plunger 64 and secured thereto by threads, adhesive, or the like.

The plunger 64 normally reposes in an upper or retracted position in housing 58 due to the bias of spring 68. However the plunger may be moved to an extended position in opposition to that spring bias by pressing down on the head 66.

Figure 2:
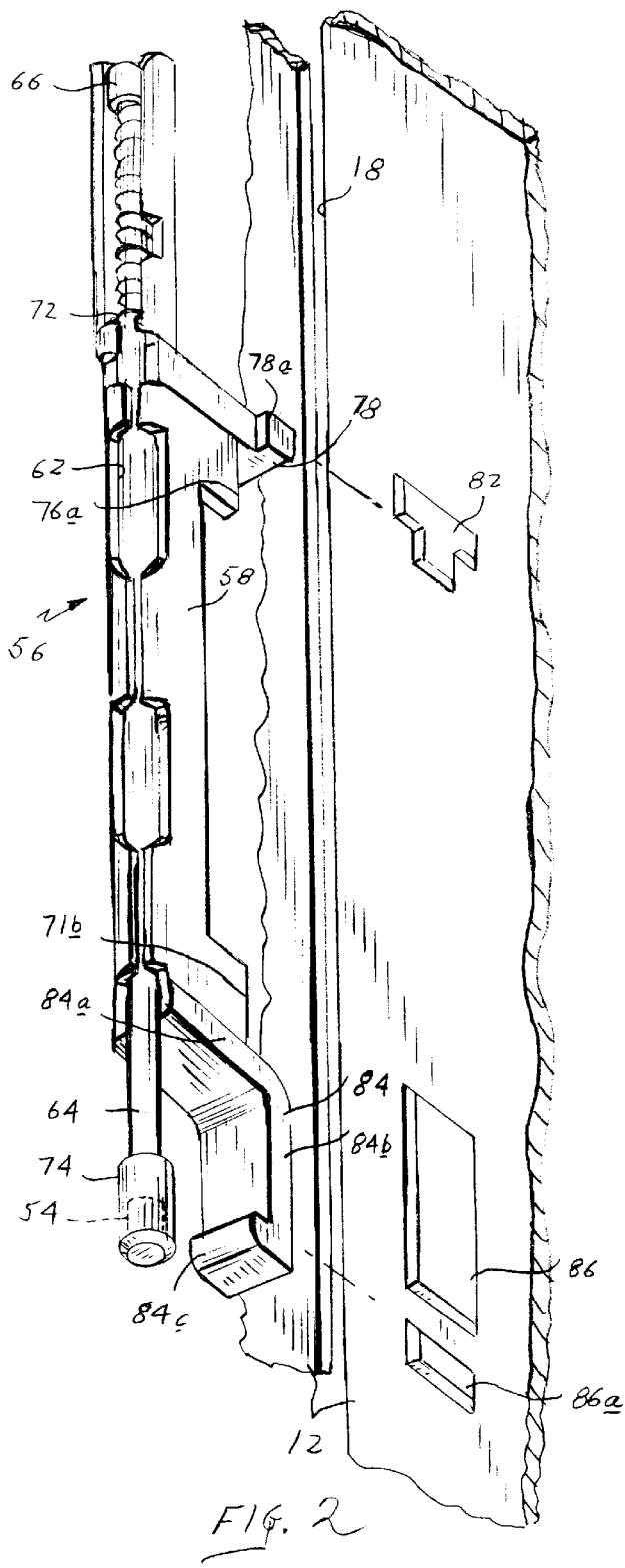
FIG. 2 is an exploded fragmentary perspective view of a portion of a switch mechanism in FIG. 1.
Figure 3:
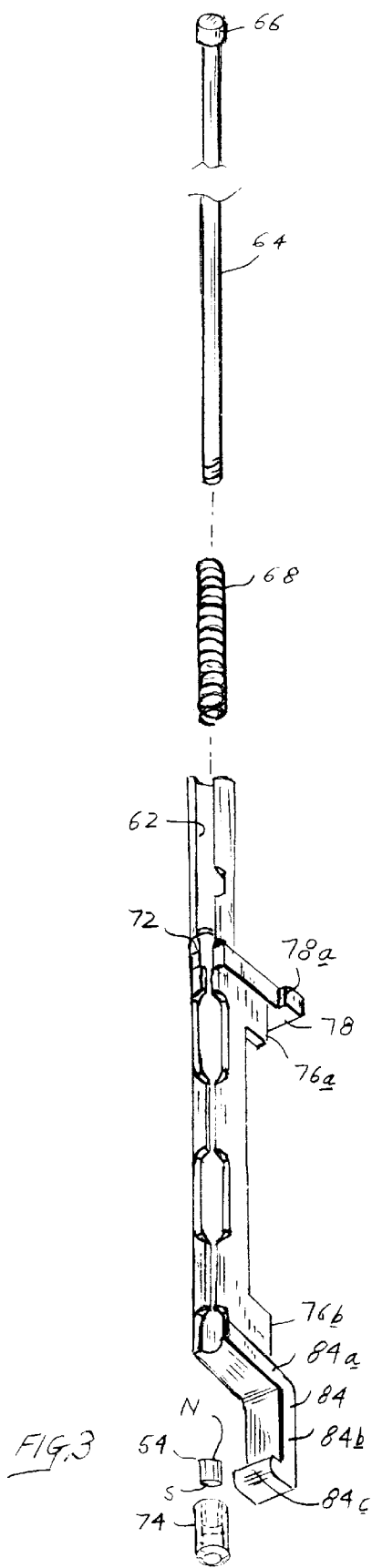
FIG. 3 is a similar view showing the components of the switch mechanism in greater detail.
Figure 4:
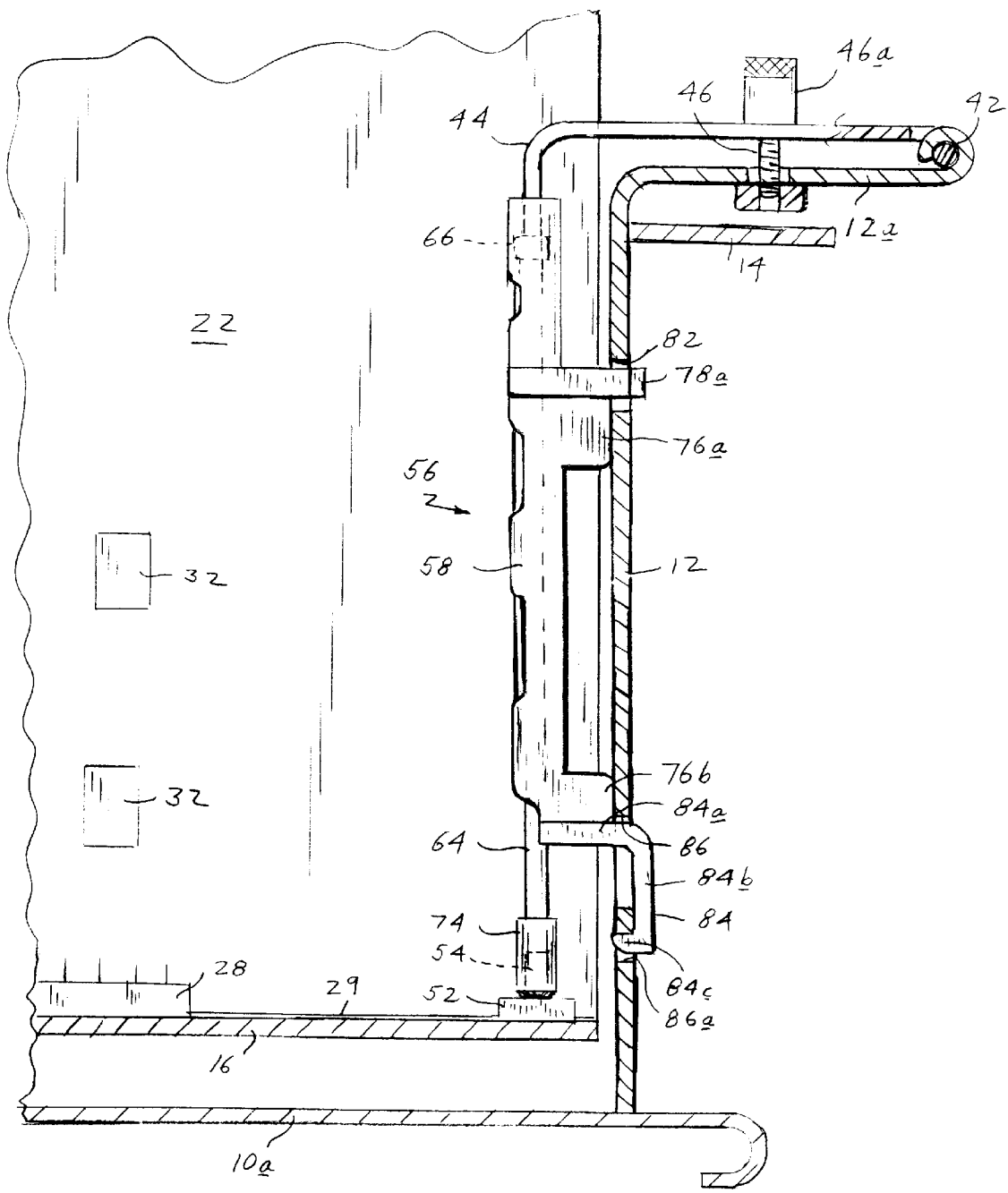
FIG. 4 is a sectional view with parts in elevation showing the operation of the switch mechanisms in FIG. 1.

As best seen in FIGS. 2 and 4, housing 58 is formed with co-planer upper and lower locating edges 76a and 76b, respectively, which are arranged to seat against the inner face of the chassis front wall 12. Formed in housing 58 just above edges 76a is a rearwardly extending T-shaped key 78 having opposite laterally extending arms 78a, the distance between the arms 78a and the housing rear edges 76a being slightly greater than the thickness of the chassis front wall 12. As we shall see, the key 78 is arranged to engage in a T-shaped key hole 82 (FIG. 2) present in the chassis front wall 12 adjacent to a slot 18.

The assembly housing 58 plunger is also formed with a generally L-shaped hook 84 at the lower end of the housing just below edges 76b thereof. Hook 84 has a relatively short lateral leg 84a extending beyond housing edges 76b and a longer downwardly extending leg 84b which is terminated by a rearwardly extending nose 84c. As shown in FIG. 2, the distance between the rear face of leg 84b and the housing edges 76b is slightly greater than the thickness of the chassis front wall 12 so that the hook can be engaged to that wall through a rectangular opening 86 and a smaller opening 86a (FIG. 2) in that wall.

In order to attach the plunger assembly 56 to front wall 12 of the chassis, the mechanism is oriented perpendicular to the rear face of that wall so that the free end of the hook 84 faces the opening 86 in wall 12. The end of the hook is then inserted through that opening and mechanism 56 swung up toward the rear face of wall 12. As the locating edges 76a and 76b of the housing 58 approach the rear face of that wall, the nose 84c at the free end of hook 84 hooks into the smaller opening 86a below opening 86 thereby securing the lower end of the plunger assembly to wall 12. The engagement of the hook 84 to wall 12 also jacks the plunger assembly housing 58 vertically enough to enable the key 78 to be pressed into key hole 82 in the wall until the locating edges 76a engage the rear face of the wall. This suffices to secure the upper end of the housing 58 to the wall so that the plunger 64 in that housing is located directly above the associated power switch 52 on the motherboard 16.

When each plunger assembly 56 is properly mounted to chassis wall 12 adjacent to a card slot 18, the upper end of the assembly housing 58 is positioned so that when the cover 38 at the entrance to that slot is closed as shown in FIG. 4, the finger 44 at the end 38b of that cover is aligned with and presses down on the head 66 of the plunger 64 in that housing. This moves plunger 64 to its extended position thereby bringing the magnet 54 attached to the end of that plunger into proximity with the corresponding Hall Effect switch 52 on motherboard 16 thereby closing that switch. On the other hand when the cover 38 is moved to its opened position shown in FIG. 1, the finger 44 is released from the plunger head 66 so that the plunger is moved to its retracted position by the associated spring 68 in housing 58. As soon as the magnet 54 at the end of that plunger is moved away from switch 52, the switch opens thereby interrupting the delivery of power from motherboard 16 to the power buses of circuit board 22.

In other words, cover 38 and the associated plunger assembly 56 constitute as actuator assembly for actuating the corresponding switch 52 on the motherboard.

Normally circuit boards 22 occupy all of the card slots 18 in chassis 10 and all of the covers 38 are secured in their closed positions by their respective threaded fasteners 46. Resultantly, all of the circuit boards 22 are connected electrically to the motherboard 16 and held in place within the chassis. Also, the plungers 64 in all of the plunger assemblies 56 are maintained in their extended positions by the cover fingers 44. Therefore, all of the Hall Effect switches 52 are closed by the magnets 54 at the ends of their respective plunger assemblies so that power is delivered by the motherboard 16 to all of the circuit boards 22 that are plugged into their connectors 28.

When one of the circuit boards malfunctions, it may be removed from chassis 10 and replaced with a fresh board without materially affecting the operation of the other circuit boards 22 in the chassis. To remove the defective board, the cover 38 at the entrance to the slot 18 containing that board is unfastened and moved to its open position shown in FIG. 1. The opening of the cover not only allows the defective circuit board to be removed from its slot in the chassis, but also releases the plunger 64 of the corresponding plunger assembly 56 thereby changing the state of the switch 52 controlling the delivery of power to that circuit board. In other words, as soon as the magnet 54 at the end of that plunger is retracted away from the switch 52, the switch opens thereby interrupting the delivery of power via bus conductor 29 to the defective circuit board 22. After the defective circuit board is removed and replaced by a fresh board plugged into the connector 28 of the motherboard 16, the cover 38 at the entrance to the slot containing the fresh board may be moved to its closed position shown in FIG. 4. As the cover approaches its closed position, the finger 44 at the free end of that cover presses down on the plunger head 66 of the corresponding plunger assembly 56 causing the plunger to move to its extended position which brings the magnet 54 at the end of that plunger in close proximity to the associated power switch 52 on motherboard 16. Resultantly, switch 52 closes thereby establishing power to the fresh circuit board 22.

It will be appreciated from the foregoing that neither the switch 52 nor the plunger assembly which operates the switch takes up any space whatsoever on the circuit board 22 whose power is being controlled by that switch. Also, switch 52 being a standard Hall Effect switch is relatively inexpensive as compared with mechanical switches conventionally used for this purpose. Furthermore, that switch and the associated plunger assembly 56 are well able to withstand mechanical vibrations and shock forces and will operate properly even when the manufacturing tolerances of the chassis 10 are not very tight. In other words, a certain amount of over travel may be built into the plunger assembly 56, e.g. 30–40 mils, so that the switch mechanism will operate properly despite dimensional variations in the chassis from unit to unit.

It will thus be see that the objects set forth above, among those made apparent from the preceding description, are efficiently attained. Also, certain changes may be made in the above construction without departing from the scope of the invention. For example, the power switches 52 on motherboard 16 could be some other kind of electronic proximity switch, e.g., a capacitance-type switch which is closed when the lower end of plunger 64 approaches. Therefore, it is intended that all matter contained in the above description or shown in the accompanying drawings shall be interpreted as illustrative and not in a limiting sense.

It is also to be understood that the following claims are intended to cover all of the generic and specific features of the invention described herein.

What is claimed is:

1. A hot plug switch mechanism comprising a card chassis;

a motherboard in the chassis, said motherboard including a power bus, a plurality of connectors for connection to a corresponding plurality of circuit boards in the chassis and separate power switches connected between the power bus and each connector, each switch having an open position and a closed position, and a plurality of actuator assemblies on the chassis corresponding to the plurality of power switches on the motherboard, each actuator assembly being positioned to maintain the corresponding power switch in its said closed position when the corresponding connector is connected to a circuit board.

2. The switch mechanism defined in claim 1 wherein each power switch is a Hall Effect switch, and each actuator assembly includes a magnet that produces a magnetic field which closes the corresponding Hall Effect switch only when the magnet is in close proximity to such switch and means for moving said magnet into close proximity to said switch when the corresponding connector is connected to a circuit board.

3. The switch mechanism defined in claim 1 wherein the chassis comprises a wall extending substantially perpendicular to the motherboard, and each actuator assembly comprises a plunger assembly mounted to said wall, said plunger assembly including a housing, a connection connecting said housing to said wall, a plunger slidably mounted in the housing, said plunger having a first end facing the corresponding power switch and an opposite end, said plunger being movable between an extended position wherein the plunger first end extends to and closes the corresponding power switch and a retracted position wherein the plunger first end is spaced away from and does not close said corresponding power switch and a spring biasing the plunger to its said retracted position, and a cover member corresponding to each plunger assembly and movably mounted to said wall, each cover member being movable between a closed position wherein said cover member engages said opposite end of the corresponding plunger so as to maintain that plunger in its said extended position and an open position wherein the cover member is disengaged from said opposite end of the corresponding plunger so that the plunger is urged by the corresponding spring to its said retracted position.

4. The switch mechanism defined in claim 3 wherein each power switch is a Hall Effect switch, and each actuator assembly includes a magnet mounted to said one end of the corresponding plunger, said magnet producing a magnetic field which closes the corresponding Hall Effect switch when said plunger is in its said extended position.

5. The switch mechanism defined in claim 4 wherein said magnet is contained in a cup engaged over said one end of the plunger.

6. The switch mechanism in defined in claim 3 wherein said wall includes a plurality of slots corresponding to said plurality of cover members, each slot having an entrance which is closed by the corresponding cover members when that cover is in its closed position.

7. The switch mechanism defined in claim 6 wherein each said actuator assembly connection includes a hook at the lower end of the corresponding housing which hooks through an opening in said wall, and a key at the upper end of each housing which keys into a keyhole in said wall, each hook/key pair lying on an axis which is parallel to the slots in said wall.

8. A hot plug switch mechanism comprising a motherboard;

an electronic switch on the motherboard;

a plunger assembly including a housing, a plunger slidably supported in the housing for movement between an extended position and a retracted position, and a resilient member for biasing the plunger to said retracted position;

a support supporting the motherboard and plunger assembly relatively so that the plunger assembly is disposed opposite the switch whereby when the plunger is moved to its said extended position, the plunger closes the switch, and means for moving the plunger to said extended position.

9. The switch mechanism defined in claim 8 wherein the support comprises a chassis which supports the plunger assembly perpendicular to the motherboard.

10. The switch mechanism defined in claim 9 wherein the chassis includes a slot defining a circuit board position, said slot extending perpendicular to the motherboard and having an entrance;

the switch is located on the motherboard adjacent to the slot, and the moving means includes a cover member movably mounted to the chassis for movement between a closed position wherein the cover member overlies the slot entrance and an open position wherein the cover member is spaced away from and exposes the slot entrance.

11. The switch mechanism defined in claim 10 and further including a fastener for releasably securing the cover member in said closed position.

12. The switch mechanism defined in claim 8 wherein said switch is a Hall Effect switch, and a magnet is mounted to said plunger facing said switch so that when the plunger is moved to said extended position, the magnet is sufficiently near said switch to close the switch.

13. The switch mechanism defined in claim 3 wherein in said opposite end of the plunger is recessed into said housing.

14. A hot plug switch comprising a motherboard;

an electronic switch on the motherboard;

a plunger assembly including a housing, a plunger having opposite ends and slidably supported in the housing for movement between an extended position and a retracted position and a resilient member for biasing the plunger to said retracted position;

a support supporting the motherboard and plunger assembly relatively so that one end of the plunger is disposed opposite the switch whereby when the plunger is moved to its said extended position, said one end of the plunger closes the switch, the other end of the plunger being recessed into said housing when the plunger is in its extended and retracted positions.

15. The switch mechanism defined in claim 14 and further including means for moving the plunger to said extended position.

* * * * *

UNITED STATES PATENT AND TRADEMARK OFFICE
CERTIFICATE OF CORRECTION

PATENT NO. : 6,355,991 B1
DATED : March 12, 2002
INVENTOR(S) : Goff et al.

It is certified that error appears in the above-identified patent and that said Letters Patent is hereby corrected as shown below:

<u>Title page,</u>
Item [56], should read as follows:
-- [56] References Cited
U.S. PATENT DOCUMENTS

| | | |
|---|---|---|
| 4,700,348 A * | 10/1987 | Ise et al. |
| 4,835,737 A * | 5/1989 | Herrig et al. |
| 4,999,787 A * | 3/1991 | McNally et al. |
| 5,272,584 A * | 12/1993 | Austruy et al. |
| 5,418,404 A * | 5/1995 | Araoka et al. |
| 5,530,302 A | 6/1996 | Hamre et al. |
| 5,991,158 A | 11/1999 | Chan et al. |
| 6,232,676 B1 * | 5/2001 | Kozyra et al. |

FOREIGN PATENT DOCUMENTS

| | | |
|---|---|---|
| 0486172 A1 | 5/1992 | European Pat. Off. |
| 0534675 A2 | 3/1993 | European Pat. Off. -- |

<u>Column 7,</u>
Line 54, delete "in" so that the claim reads as follows:
-- 6. The switch mechanism defined in claim 3 wherein said wall includes a plurality of slots corresponding to said plurality of cover members, each slot having an entrance which is closed by the corresponding cover members when that cover is in its closed position. --

UNITED STATES PATENT AND TRADEMARK OFFICE
CERTIFICATE OF CORRECTION

PATENT NO. : 6,355,991 B1
DATED : March 12, 2002
INVENTOR(S) : Goff et al.

It is certified that error appears in the above-identified patent and that said Letters Patent is hereby corrected as shown below:

Column 8,
Line 43, delete "in" so that the claim reads as follows:
-- 13. The switch mechanism defined in claim 3 wherein said opposite end of the plunger is recessed into said housing. --

Signed and Sealed this

Seventeenth Day of December, 2002

JAMES E. ROGAN
*Director of the United States Patent and Trademark Office*